(12) United States Patent
Ozeki et al.

(10) Patent No.: US 9,478,527 B2
(45) Date of Patent: Oct. 25, 2016

(54) SEMICONDUCTOR LIGHT EMITTING DEVICE

(71) Applicant: NICHIA CORPORATION, Anan-shi, Tokushima (JP)

(72) Inventors: Kenji Ozeki, Tokushima (JP); Tomonori Miyoshi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/152,139

(22) Filed: May 11, 2016

(65) Prior Publication Data

US 2016/0254254 A1    Sep. 1, 2016

Related U.S. Application Data

(63) Continuation of application No. 14/582,323, filed on Dec. 24, 2014, now Pat. No. 9,379,294.

(30) Foreign Application Priority Data

Dec. 27, 2013    (JP) .................................. 2013-272592

(51) Int. Cl.
*H01L 33/00*    (2010.01)
*H01L 25/075*    (2006.01)
(Continued)

(52) U.S. Cl.
CPC .......... *H01L 25/0753* (2013.01); *H01L 33/486* (2013.01); *H01L 33/507* (2013.01); *H01L 33/508* (2013.01); *H01L 33/54* (2013.01); *H01L 33/56* (2013.01); *H01L 33/60* (2013.01);
(Continued)

(58) Field of Classification Search
CPC ................................ H01L 33/60; H01L 33/20
USPC ............................................... 257/98; 438/27
See application file for complete search history.

(56) References Cited

U.S. PATENT DOCUMENTS

| 7,629,620 | B2 * | 12/2009 | Maeda | C09K 11/025 257/100 |
| 2010/0051978 | A1 * | 3/2010 | Katsuno | H01L 33/32 257/94 |

(Continued)

FOREIGN PATENT DOCUMENTS

| JP | 2010-192629 A | 9/2010 |
| JP | 2010-219324 A | 9/2010 |
| JP | 2010-283281 A | 12/2010 |
| JP | 2012-004303 A | 1/2012 |
| JP | 2012-243822 A | 12/2012 |

*Primary Examiner* — Jami M Valentine
(74) *Attorney, Agent, or Firm* — Squire Patton Boggs (US) LLP

(57) ABSTRACT

A light emitting device includes a substrate, a light emitting element mounted on the substrate, a light transmissive member placed on an upper surface of the light emitting element, and a sealing member which seals the light emitting element and the light transmissive member. The light transmissive member is a plate-shaped member not containing a phosphor and is larger than the light emitting element when viewed from above. The sealing member includes a first sealing member which is formed of a light reflecting member for reflecting light emitted from the light emitting element and covers side surfaces of the light emitting element, and a second sealing member which contains a phosphor for converting the light emitted from the light emitting element into light having wavelength different from wavelength of the light emitted from the light emitting element and covers at least an upper surface of the light transmissive member.

15 Claims, 10 Drawing Sheets

(51) Int. Cl.
*H01L 33/62* (2010.01)
*H01L 33/54* (2010.01)
*H01L 33/60* (2010.01)
*H01L 33/50* (2010.01)
*H01L 33/56* (2010.01)
*H01L 33/48* (2010.01)

(52) U.S. Cl.
CPC ......... *H01L33/62* (2013.01); *H01L 2933/005* (2013.01); *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 2011/0309388 A1* | 12/2011 | Ito | H01L 33/60 257/89 |
| 2012/0032578 A1* | 2/2012 | Annen | B82Y 30/00 313/483 |
| 2012/0140506 A1* | 6/2012 | Waragawa | H01L 25/0753 362/516 |
| 2012/0236582 A1* | 9/2012 | Waragaya | H01L 33/507 362/510 |
| 2014/0175495 A1* | 6/2014 | Chuang | H01L 33/0079 257/99 |

\* cited by examiner

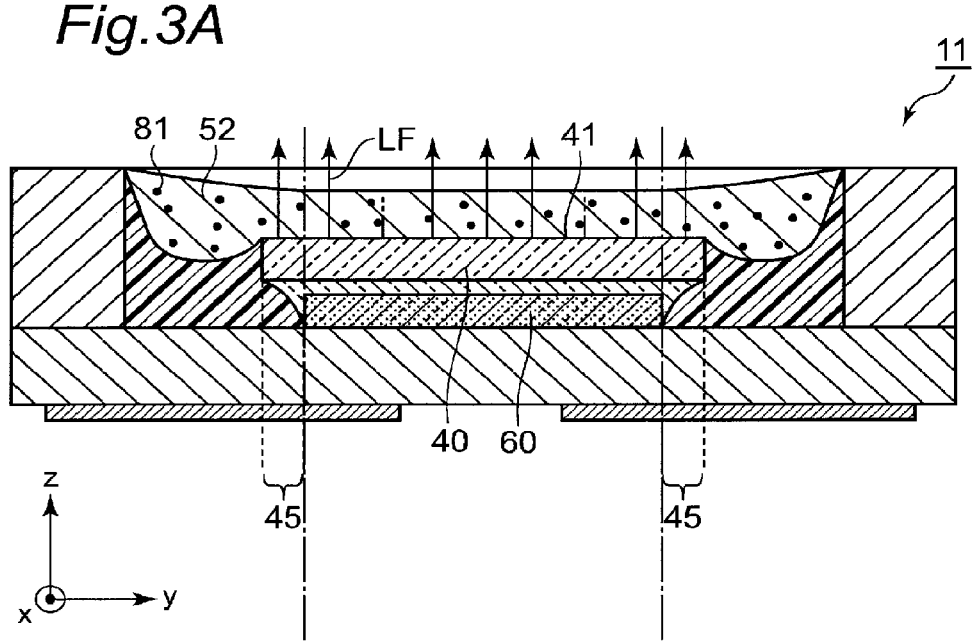
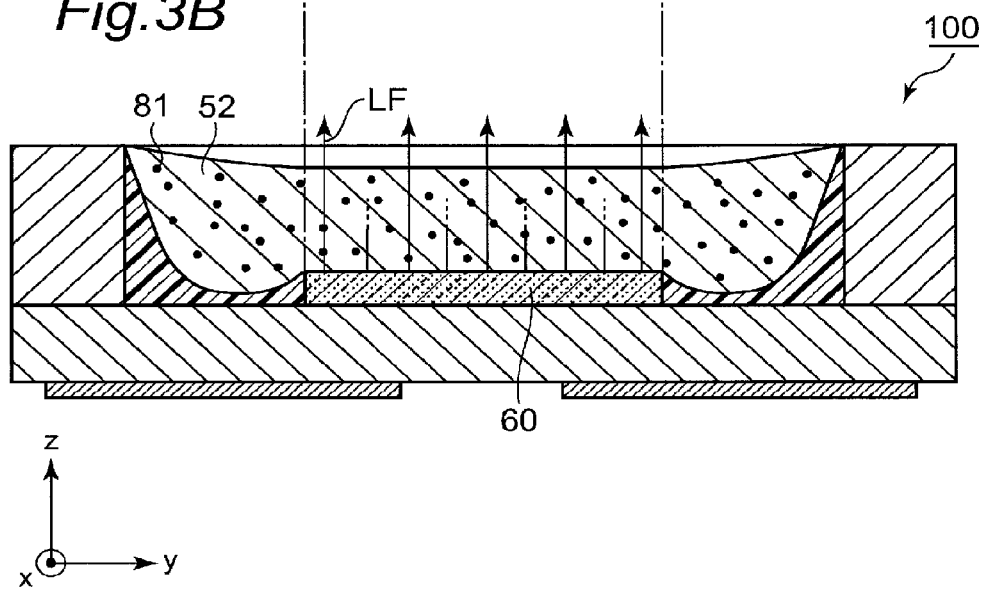

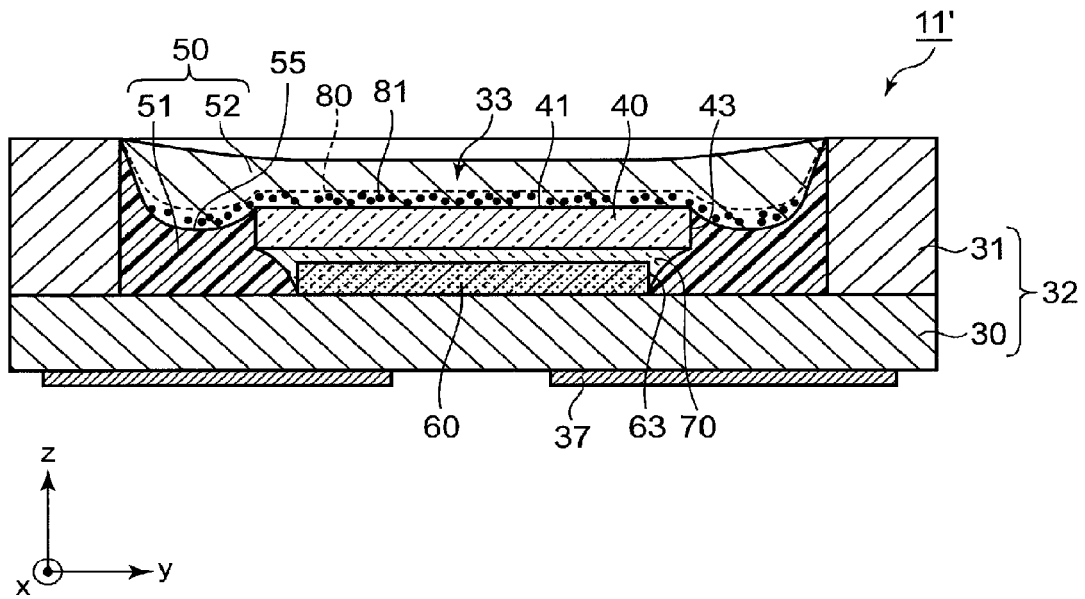
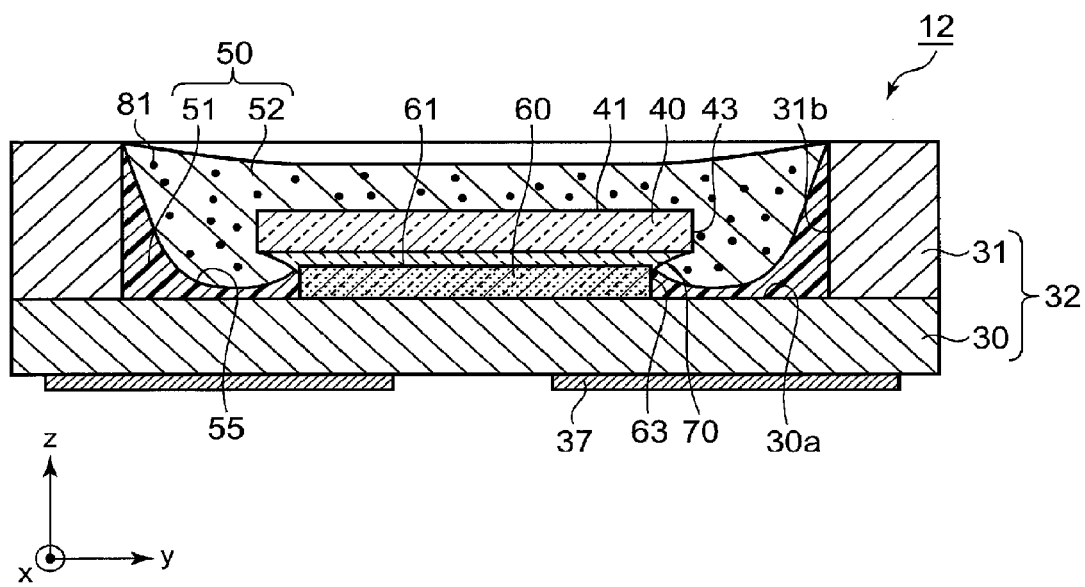

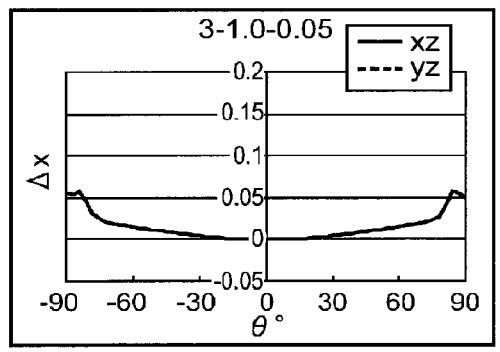
Fig.9A Δx
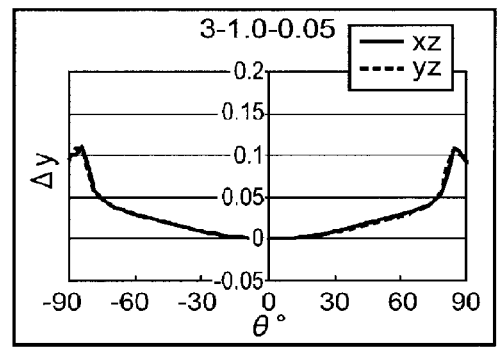
Fig.9B Δy
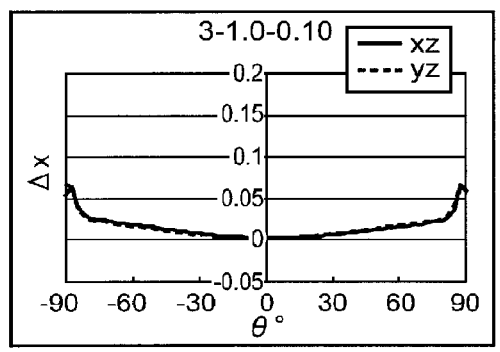
Fig.10A Δx
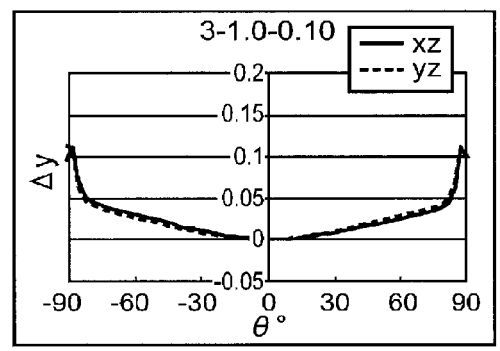
Fig.10B Δy
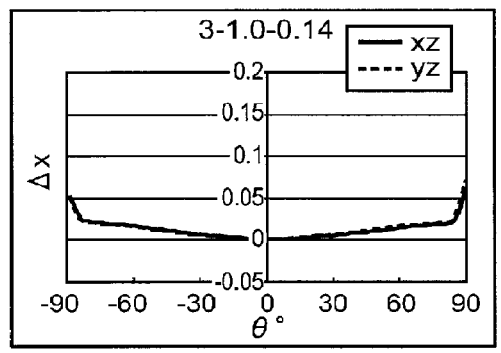
Fig.11A Δx
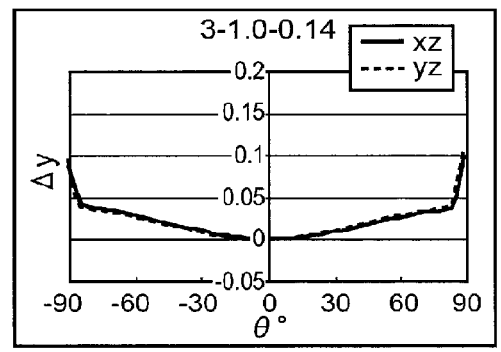
Fig.11B Δy

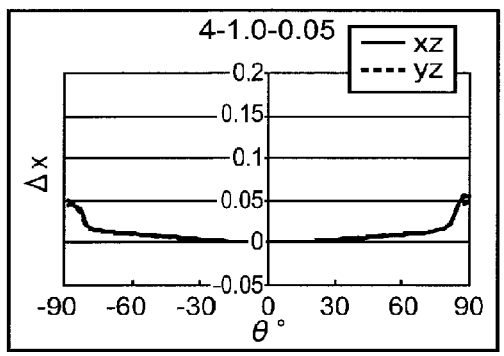
*Fig. 12A* Δx
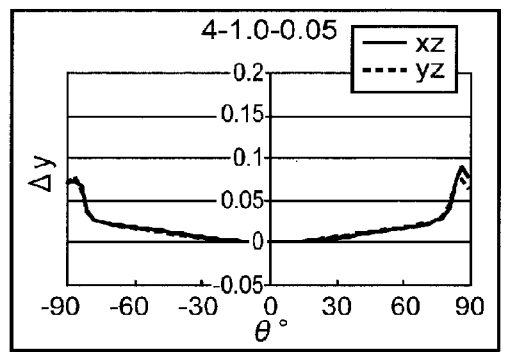
*Fig. 12B* Δy
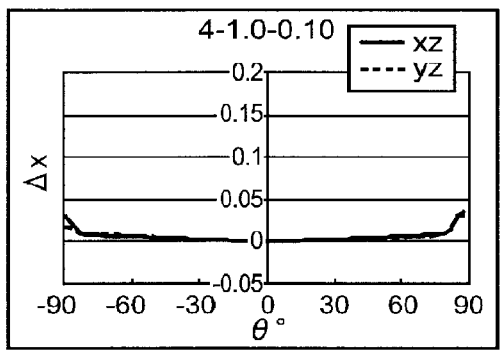
*Fig. 13A* Δx
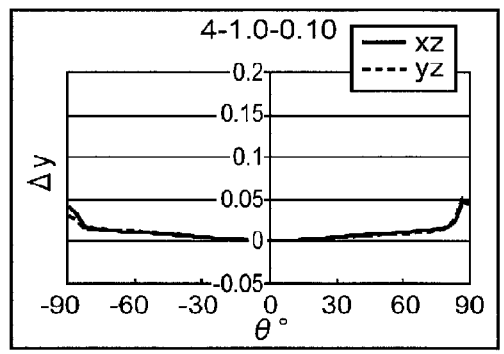
*Fig. 13B* Δy
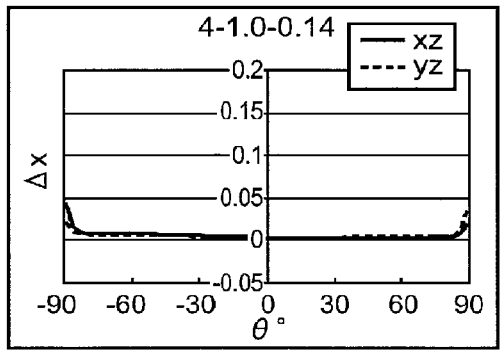
*Fig. 14A* Δx
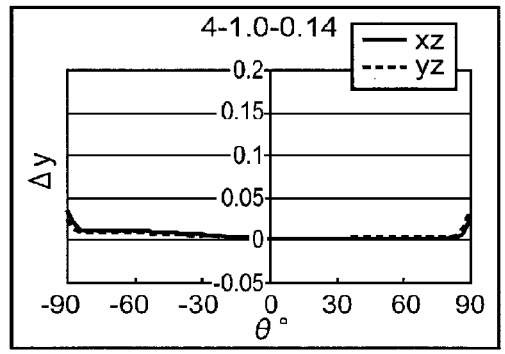
*Fig. 14B* Δy

*Fig. 15A* Δx 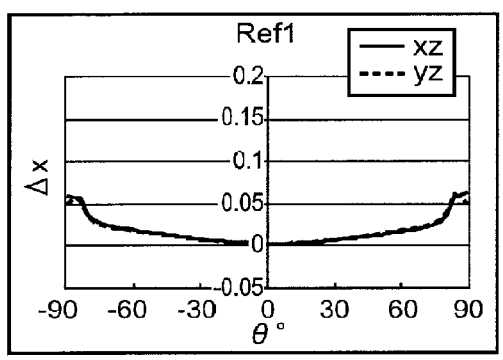 *Fig. 15B* Δy 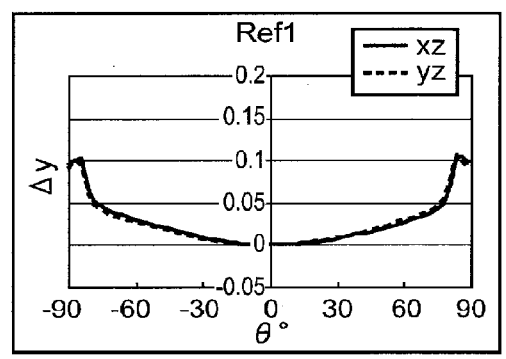

SEMICONDUCTOR LIGHT EMITTING DEVICE

CROSS-REFERENCE TO RELATED APPLICATION

This application is a 37 C.F.R. §1.53(b) Continuation of co-pending application Ser. No. 14/582,323 filed on Dec. 24, 2014, which claims priority to Japanese Patent Application No. 2013-272592, filed on Dec. 27, 2013. The entire contents of all of the above applications are hereby incorporated by reference.

BACKGROUND

1. Field

The present invention relates to semiconductor light emitting devices.

2. Description of Related Art

There have been known light emitting devices that include a light emitting element mounted on a mounting substrate, and a plate-shaped light transmissive member in which a phosphor is dispersed is disposed on an upper surface of the light emitting element (for example, JP 2012-4303 A and JP 2010-192629 A). In such light emitting devices, for example, a combination of a blue light emitting element as the light emitting element and a yellow phosphor which can wavelength-convert a blue light to a yellow light as the phosphor in the light transmissive member may be used. A part of the blue light from the light emitting element is converted into a yellow light by the phosphor, while the rest of the blue light is allowed to pass through the light transmissive member unchanged; thus obtaining a white light which is a mixture of the yellow light and the blue light. As described above, a light emitting device to emit an intended color of light, for example a white light, can be obtained by combining a light emitting element to emit an intended color of light and one or more appropriate types of phosphors.

In the light emitting devices described in JP 2012-4303 A and JP 2010-192629 A, the light transmissive members have larger area than that of the light emitting elements when viewed from the light emitting surfaces (upper surfaces of the light emitting devices). The light incident in the light transmissive member from the light emitting element travels in the light transmissive member and is emitted from the whole upper surface of the light transmissive member. Therefore, when viewed from the light emitting surface, the light emitting area of the light emitting element appears practically enlarged.

However, in the light emitting devices such as described in JP 2012-4303 A and JP 2010-192629 A, the light transmissive members do not have sufficient brightness at the edge portions compared with the central portions which are directly above the respective light emitting elements. Thus, satisfactory expansion in such a practically enlarged appearance of the light emitting areas may not be attained.

SUMMARY

In view of the above, an object of the embodiments of the present invention is to provide a light emitting device in which practical appearance of the light emitting area (hereinafter may be referred to as "practical light emitting area") of the light emitting element can be effectively enlarged. The inventors have found that due to the phosphor contained in the light transmissive member, the light does not sufficiently spread to the edge part of the light transmissive member.

In view of the above, a light emitting device according to the present invention includes a substrate, and a light emitting element mounted on the substrate. A light transmissive member is placed on an upper surface of the light emitting element, and a sealing member seals the light emitting element and the light transmissive member. The light transmissive member is a plate-shaped member which does not contain a phosphor and is larger than the light emitting element when viewed from above. The sealing member includes a first sealing member which is formed of a light reflecting member for reflecting light emitted from the light emitting element and covers side surfaces of the light emitting element, and a second sealing member which contains a phosphor for converting the light emitted from the light emitting element into light having a wavelength different from a wavelength of the light emitted from the light emitting element. The sealing member covers at least an upper surface of the light transmissive member.

According to the present invention, the phosphor is contained in the second sealing member; thus, the light transmissive member does not need to contain a phosphor. As a result, the light can spread to the edge portion of the light transmissive member, and a practical light emitting area of the light emitting element can be effectively enlarged.

BRIEF DESCRIPTION OF THE DRAWINGS

FIGS. 3A and 3B are schematic cross-sectional views illustrating an advantageous effect of the light emitting device according to the first embodiment; FIG. 3A shows a light emitting element according to the present embodiment; and FIG. 3B shows a conventional light emitting element.

FIG. 4 is a schematic cross-sectional view of a modified example of a light emitting device according to the first embodiment.

FIG. 5 is a schematic cross-sectional view of a light emitting device according to a second embodiment.

FIGS. 9A and 9B are graphs showing experimental results of a second example.

FIGS. 10A and 10B are graphs showing experimental results of the second example.

FIGS. 11A and 11B are graphs showing experimental results of the second example.

FIGS. 12A and 12B are graphs showing experimental results of the second example.

FIGS. 13A and 13B are graphs showing experimental results of the second example.

FIGS. 14A and 14B are graphs showing experimental results of the second example.

FIGS. 15A and 15B are graphs showing experimental results of the second example.

DETAILED DESCRIPTION OF EMBODIMENTS

Hereinafter, embodiments of the present invention will be described in detail with reference to the drawings. In the following description, terms (for example, "upper", "lower", "right", "left", and other terms containing these terms) which represent certain directions and positions may be used as needed. However, these terms are used for easy understanding of the description with reference to the drawings, and the meanings of these terms do not limit the technical scope of the present invention. The same numerals in different drawings indicate the same or similar portions or members.

First Embodiment

Figure 1:
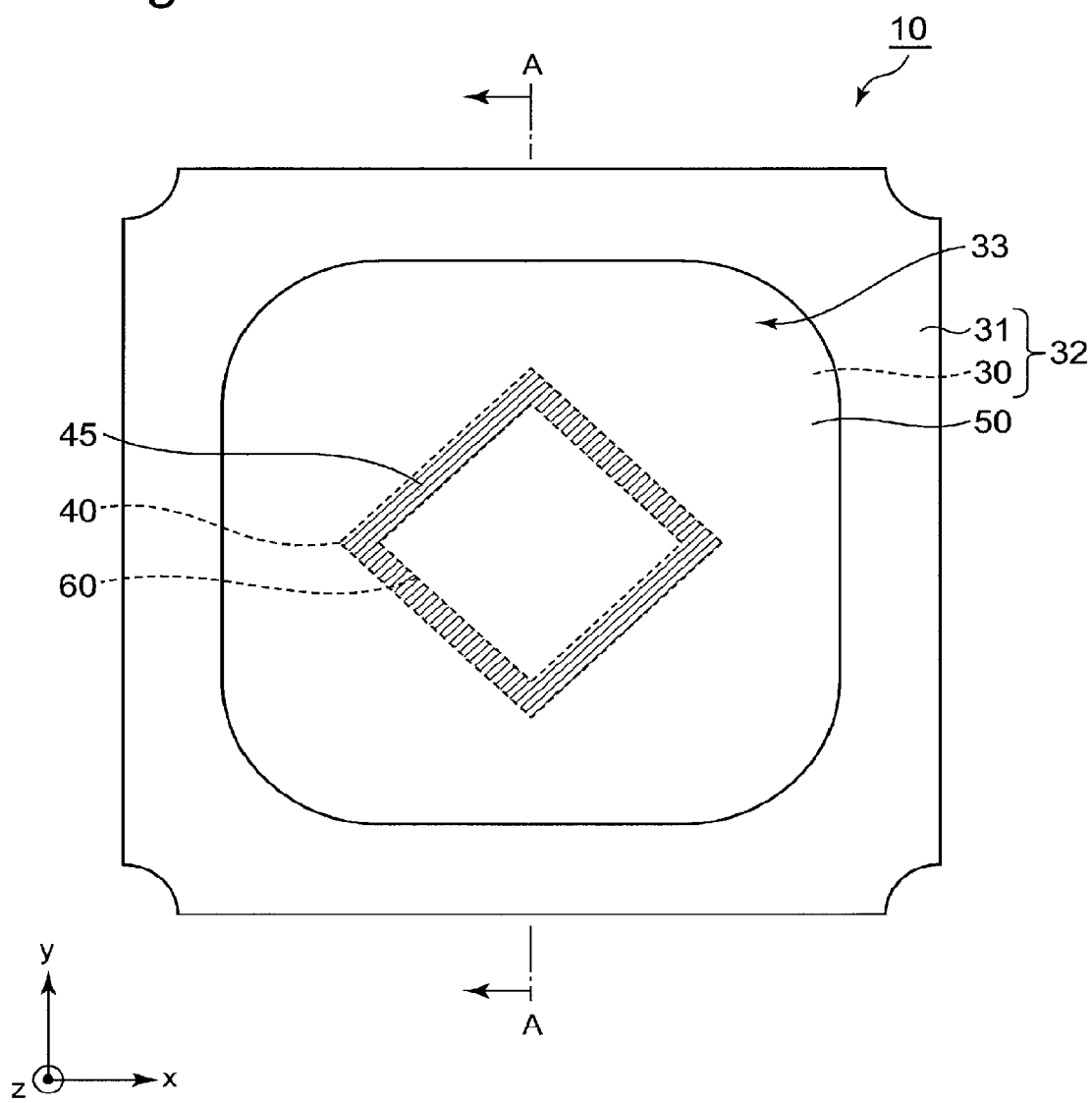
FIG. 1 is a schematic top view of a light emitting device according to a first embodiment.
Figure 2:
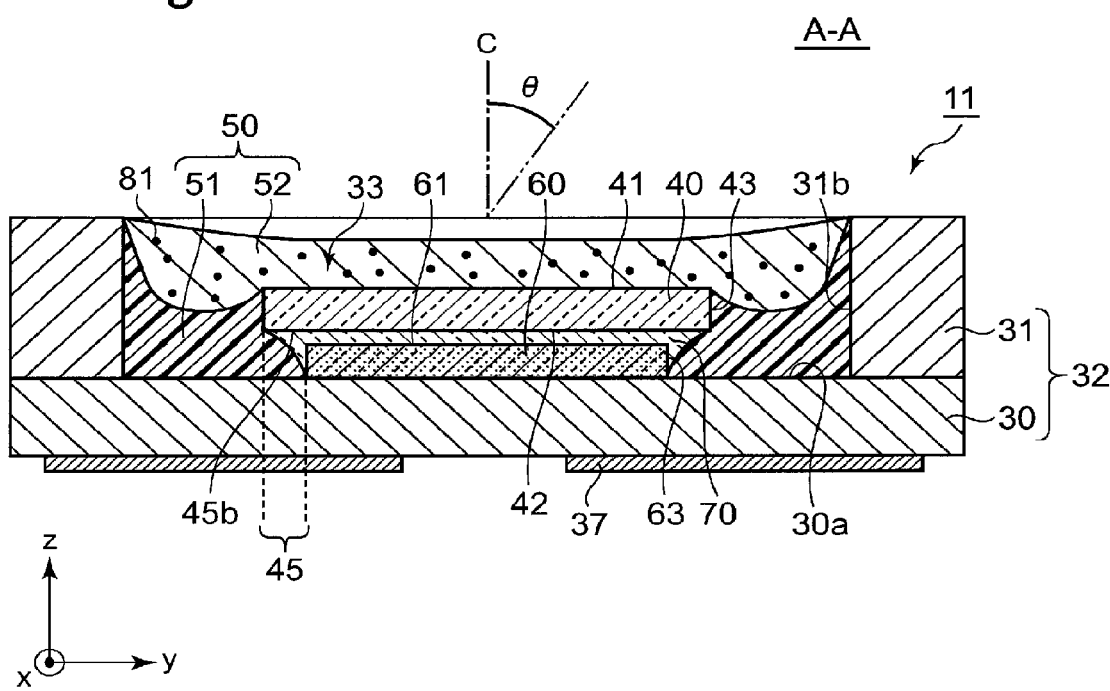
FIG. 2 is a schematic cross-sectional view of a light emitting device according to the first embodiment.

As shown in FIG. 1 and FIG. 2, a light emitting device 11 according to the present embodiment includes a housing 32 constituted of a substrate 30 and side walls 31, a light emitting element 60 mounted on an upper surface 30a of the substrate 30 in a recessed portion 33 of the housing 32, and a plate-shaped light transmissive member 40 placed over an upper surface 61 of the light emitting element 60. The light transmissive member 40 and the light emitting element 60 can be bonded by using, for example, pressure bonding, sintering, bonding with adhesive, or bonding with low melting point glass. In the light emitting device 11 according to the present embodiment, the light transmissive member 40 and the light emitting element are fixed with a light transmissive adhesive layer 70. The light emitting element 60 and the light transmissive member 40 in the recessed portion 33 are sealed with a sealing member 50 constituted of two layers. In the present embodiment, different from those described in JP 2012-4303 A and JP 2010-192629 A, a whole upper surface 41 of the light transmissive member 40 is covered with the sealing member 50.

Because, when viewed from above, the light transmissive member 40 extends beyond the outer sides or edges of the light emitting element 60, the practical light emitting area can be enlarged by the planar dimension of the portions extending beyond the outer sides of the light emitting element 60 (outer extended part 45). It is therefore preferable that the light transmissive member 40 is larger than the light emitting element 60 and the light emitting element 60 is completely covered with the light transmissive member 40 when viewed from above. In particular, it is preferable that the edge portions of the light transmissive member 40 are located beyond outer sides than the whole periphery of the light emitting element 60. Hereinafter, the advantageous effect of enlarging the practical light emitting area will be described.

When a light emitting device 100 (FIG. 3B) which is not provided with the light transmissive member 40 is observed from above, it is recognized that the upper surface 61 of the light emitting element 60 itself emits light. That is, the practical light emitting area is the planar dimension of the light emitting element 60. On the other hand, in the case where the light transmissive member 40 is placed on the upper surface 61 of the light emitting element 60 as in the embodiments of the present invention, light emitted from the upper surface 61 of the light emitting element 60 is incident to the light transmissive member 40. The incident light travels in the lateral direction (x-y plane direction) in the light transmissive member 40 and spreads throughout the whole light transmissive member 40, and is emitted from the whole of the upper surface 41 of the light transmissive member 40. Thus, when the light emitting device 11 is observed from above, the whole of the light transmissive member 40 appears to emit light.

That is, the practical light emitting area is the planar dimension of the light transmissive member 40. In addition, because the light transmissive member 40 does not contain a phosphor, the phosphor 81 does not scatter or absorb the emitted light when the emitted light travels in the light transmissive member 40. As a result, the emitted light can be spread over the whole of the light transmissive member 40.

As described above, the practical light emitting area can be efficiently increased with simply disposing the light transmissive member 40 which has a greater planar dimension than that of the upper surface 61 of the light emitting element 60 and which does not contain a phosphor 81. Note that the light transmissive member 40 does not substantially contain a phosphor but a small amount of phosphor may be unintentionally contained in the manufacturing process, or the like. With the effects of the present invention taken in cout, inclusion of a minute amount of a phosphor in the light transmissive member 40 is considered not to substantially affect the efficient increase in the practical light emitting area. Thus, the presence of such a minute amount of a phosphor can be acceptable.

In the present embodiment, the sealing member 50 is constituted of two layers 51 and 52. The lower layer 51 is a first sealing member (light reflecting layer) 51 formed of a light reflecting member, and the upper layer 52 is a second sealing member (phosphor-containing layer) 52 containing the phosphor 81 for converting the light emitted from the light emitting element 20 into light having a different wavelength.

The light reflecting layer 51 covers the side surfaces 63 of the light emitting element 60. In the present description, the term "cover" refers not only to a state in which the light reflecting layer 51 is in contact with and covers the side surfaces 63 of the light emitting element 60 but also to a state in which another member is provided between the side surfaces 63 and the light reflecting layer 51 (for example, as shown in FIG. 2, a state in which an adhesive layer 70 is arranged between the side surfaces 63 and the light reflecting layer 51). By covering the side surfaces 63 of the light emitting element 60 with the light reflecting layer 51, the light emitted from the side surfaces 63 can be reflected by the light reflecting layer 51, so that most part of the light emitted from the light emitting element can be introduced into the light transmissive member 40.

The light reflecting layer 51 may further cover the upper surface 30a of the substrate 30. The emitted light which is scattered by the phosphor 81 in the phosphor-containing layer 52 and is directed to the substrate 30 can be reflected by the light reflecting layer 51 and be extracted in an upper direction (z direction in FIG. 2). The light reflecting layer 51 may further cover the inner surfaces 31b of the side walls 31. The emitted light which is scattered by the phosphor 81 in the phosphor-containing layer 52 and is directed to the side walls 31 can be reflected by the light reflecting layer 51 to be extracted in the upper direction (z direction in FIG. 2). In particular, the substrate 30 and the side walls 31 made of a ceramic material tend to facilitate propagation of the emitted light through the substrate 30 and the side walls 31. Accordingly, covering the upper surface 30a of the substrate 30 and the inner surfaces 31b of the side walls 31 with the light reflecting layer 51 can facilitate efficient reflection of the emitted light, and thus, the light extraction efficiency in upward direction can be improved.

As shown in FIG. 2, the light reflecting layer 51 may further cover the side surfaces 43 of the light transmissive member 40. With this arrangement, the emitted light incident in the light transmissive member 40 hardly exits from the side surfaces 43, so that most of the emitted light can be emitted from the upper surface of the light transmissive member 40. This arrangement can provide advantages in reducing unevenness of color.

The phosphor-containing layer 52 constituting the upper layer of the sealing member 50 covers at least the upper surface 41 of the light transmissive member 40. With this arrangement, the light emitted from the upper surface 41 of the light transmissive member 40 can be wavelength converted by the phosphor 81 in the phosphor-containing layer 52. The phosphor 81 contained in the phosphor-containing layer 52 may be dispersed throughout the phosphor-containing layer 52. The second sealing member may be a phosphor layer formed to cover the upper surface of the light transmissive member 40. In this case, a method for forming the phosphor layer is not specifically limited, and a spray method, an electrodeposition method, or an electrostatic coating method can be used, for example. Alternatively, a phosphor sheet made of a material in which phosphor is dispersed in resin, a glass plate containing phosphor, or the like may be adhered to the light transmissive member 40. As the phosphor, a known phosphor in the art to be described below can be used.

In the present embodiment, the light transmissive member 40 does not substantially contain a phosphor, so that the light emitted from the light emitting element 60 is allowed to propagate within the light transmissive member 40 to enlarge the practical light emitting area (the light emitting area of the light emitted from the light emitting element), then, the light emitted from the large light emitting area is allowed to pass through the phosphor-containing layer 52. Thus, emission with low color unevenness can be obtained with a large area. In addition, the light emitting area is enlarged while the luminous flux exiting from the light emitting element 60 is unchanged; thus, the luminous flux per unit area is reduced. Thus, a total amount of the phosphor contained in the unit area in the thickness direction of the phosphor-containing layer 52 can be reduced. Accordingly, propagation of the emitted light through the phosphor-containing layer 52 can be facilitated, and the light extraction efficiency of the light emitting device 11 can be improved. This effect of improvement of the light extraction efficiency will be described in detail below with reference to FIG. 3.

In the present embodiment, in order to manufacture the light emitting device to emit a predetermined color of light (for example, a white light), it is necessary to appropriately adjust the amount of the phosphor 81 in the phosphor-containing layer 52 in accordance with the luminous flux of the light emitted from the light emitting element. More specifically, an increase in the luminous flux of the emitted light passing through a unit area of the emission surface requires a corresponding increase of the total amount of the phosphor 81 in the unit area in the thickness direction of the phosphor-containing layer 52. The phosphor 81 can also be a factor impairing the propagation of the emitted light, so that an increase in the total amount of the phosphor 81 may lead reduction in the amount of the emitted light passing through the phosphor-containing layer 52, which may resulting in a reduction in the light extraction efficiency of the light emitting device 11.

The theory described above will be illustrated below with reference to the schematic sectional views of the light emitting device 11 (FIG. 3A) according to an embodiment of the present invention which employs a light transmissive member 40 and a conventional light emitting device 100 (FIG. 3B) which does not employ the light transmissive member 40. Note that, in FIGS. 3A and 3B, for easier understanding of the above theory, the luminous flux LF is represented by arrows, the luminous flux LF of the light passing through the phosphor-containing layer 52 and a density of the phosphor 81 in the phosphor-containing layer 52, and the like may be shown exaggerated. In the light emitting device 11 according to an embodiment of the present invention, the light emitted from the light emitting element 60 is incident in the light transmissive member 40, propagates in the light transmissive member 40, and emitted from the whole of the upper surface 41 of the light transmissive member 40 (FIG. 3A). On the other hand, in the conventional light emitting device 100, the light emitted from the light emitting element 60 is emitted unchanged from the upper surface 61 of the light emitting element 60 (FIG. 3B).

In any of the light emitting devices, the luminous fluxes of the light emitting element 60 are substantially equal to one another; thus, the larger the area of the emission surface (referred to as a "phosphor excitation area") from the light emitting element 60 to the phosphor-containing layer 52 is, the lower the luminous flux LF (density of the luminous flux LF) per unit area of the phosphor excitation area is. In the light emitting device 11 of FIG. 3A, the phosphor excitation area is the planar dimension of the upper surface 41 of the light transmissive member 40, and in the light emitting device 100 of FIG. 3B, the phosphor excitation area is the planar dimension of the upper surface 61 of the light emitting element 60. As can be understood also from the drawings, the planar dimension of the upper surface 41 of the light transmissive member 40 is larger than the planar dimension of the upper surface 61 of the light emitting element 60 by the planar dimension of the outer extended part 45 (the part extending outer side than the light emitting device 11 in the x-y plane).

Accordingly, the light emitting device 11 of FIG. 3A has a lower density of the luminous flux LF than the light emitting device 100 of FIG. 3B (In FIGS. 3A and 3B, a wider intervals between adjacent arrows (luminous fluxes) indicates a lower density of the luminous flux LF).

In order to obtain equivalent colors of emission from the light emitting devices, the higher the density of the luminous flux LF is, the more the total amount of the phosphor 81 per unit area of the phosphor excitation area in the thickness direction in the phosphor-containing layer 52 is needed. For this reason, the total amount of the phosphor 81 in the light emitting device 100 of FIG. 3B needs to be greater; thus, the luminous flux LF does not easily pass through the phosphor-containing layer 52, whereby the light extraction efficiency of the light emitting device 100 decreases. In contrast, in the light emitting device 11 of FIG. 3A, the density of the luminous flux LF is low, so that the total amount of the phosphor 81 in the phosphor-containing layer 52 can be reduced. Accordingly, in the light emitting device 11 of FIG. 3A, the luminous flux LF can easily pass through the phosphor-containing layer 52, also that the light extraction efficiency of the light emitting device 100 can be improved.

Next, with reference to FIG. 2, a method of manufacturing the light emitting device 11 according to the present embodiment will be described. The method includes at least four steps illustrated below. In the specification, the numbers of the steps do not mean that the steps are necessarily performed in this order, and the order of step 2 and the step 3 can be interchanged.

Step 1: Mounting a light emitting element on an upper surface of a substrate;

Step 2: Placing a plate-shaped light transmissive member which is larger than the light emitting element over an upper surface of the light emitting element so as to include the light emitting element therein in a top view.

Step 3: Covering side surfaces of the light emitting element with a first sealing member formed of a light reflecting member which reflects emitted light of the light emitting element; and Step 4: Covering, after steps (2) and (3), at least an upper surface of the light transmissive member with a second sealing member containing a phosphor for converting the emitted light of the light emitting element into light with a different wavelength.

The steps will be described in detail below.

<Step 1. Mounting Light Emitting Element 60>

A substrate 30 is prepared with external electrodes 37 disposed thereon, and on which conductor wirings such as external electrodes 37 are formed is prepared, and the side walls 31 is fixed on the upper surface 30a of the substrate 30 to form the housing 32 having the recessed portion 33. Note that as the housing 32, there can be used a housing in which the substrate 30 and the side walls 31 are integrally molded in advance. The light emitting element 60 is mounted on a bottom surface (the upper surface 30a of the substrate 30) of the recessed portion 33. By appropriately connecting, at this time, electrodes of the light emitting element 60 to the conductor wirings provided on the substrate 30, the light emitting element 60 can be supplied with electricity from the external electrodes 37.

<Step 2. Placing Light Transmissive Member 40>

The light transmissive member 40 which has a larger planar dimension than that of the upper surface 61 of the light emitting element 60 is prepared and is placed on the upper surface 61 of the light emitting element 60. At this time, it is preferable that the light emitting element 60 and the light transmissive member 40 are mutually fixed with adhesive. The adhesive may cover not only a boundary between the upper surface 61 of the light emitting element 60 and the lower surface 42 of the light transmissive member 40 but also the side surfaces 63 of the light emitting element 60 and a lower surface 45b of the outer extended part 45 of the light transmissive member 40. The adhesive is cured to form the light transmissive adhesive layer 70. Because the light transmissive member 40 is placed so as to completely cover the upper surface 61 of the light emitting element 60, the emitted light exiting from the upper surface 61 of the light emitting element 60 can be efficiently introduced into the light transmissive member 40.

<Step 3. Forming Light Reflecting Layer 51>

The light reflecting layer 51 can be formed of a resin material to which light reflective substance is added (light reflective resin). After light reflective substance is added to a liquid resin material before being cured, the liquid resin material is dropped in a gap between the side walls 31 of the housing 32 and the light transmissive member 40. The dropped liquid resin material first comes in contact with the upper surface 30a of the substrate 30 and then climes up, by surface tension, the inner surfaces 31b of the side walls 31, the surface of the adhesive layer 70 (in other words, indirectly the side surfaces 63 of the light emitting element 60), and the side surfaces 43 of the light transmissive member 40 to cover the surfaces thereof. In this way, the light reflecting layer 51 having a cross-sectional shape as shown in FIG. 2 is easily formed. Finally, the liquid resin material is cured to form the light reflecting layer 51.

<Step 4. Forming Phosphor-Containing Layer 52>

The phosphor-containing layer 52 can be formed of a resin material to which the phosphor 81 is added (phosphor-containing resin). After the phosphor 81 is added to a liquid resin material before being cured, the liquid material is dropped on the upper surface 41 of the light transmissive member 40. The dropped liquid resin material spreads from the upper surface 41 of the light transmissive member 40 to the upper surface of the light reflecting layer 51 and fills inside the recessed portion 33. Finally, the liquid resin material is cured to form the phosphor-containing layer 52. In this way, the light emitting device 11 according to the present embodiment is obtained.

Modified Example

FIG. 4 shows a light emitting device 11' according to a modified example of the present embodiment. The light emitting device 11' is different from the light emitting device 11 shown in FIG. 2 in a state of dispersion of the phosphor 81 contained in the phosphor-containing layer 52. Specifically, in the light emitting device 11' according to the present modified example, in the phosphor-containing layer 52, the phosphor 81 is deposited on the upper surface 41 of the light transmissive member 40 and on a boundary surface 55 between the phosphor-containing layer 52 and the light reflecting layer 51. A region in the phosphor-containing layer 52 in which the phosphor 81 is deposited represents a phosphor layer 80. Note that the expression "to be deposited" in this detailed description means "to be submerged near the bottom," and the phosphor 81 is deposited in the phosphor-containing layer 52 to form the phosphor layer 80 in which the phosphor exists densely.

If the phosphor 81 is deposited, a part of the emitted light exiting from the upper surface 41 of the light transmissive member 40 toward the phosphor-containing layer 52 is wavelength converted while the emitted light is passing through the phosphor layer 80 deposited on the upper surface 41. Because the phosphor 81 is dense in the phosphor layer 80, the probability of collision of the emitted light with the phosphor 81 is higher (than in the case that the phosphor 81 is thin). That is to say, if the amount of the phosphor 81 contained in the phosphor-containing layer 52 is the same, the emitted light is wavelength converted at a higher rate (wavelength conversion rate) in the case that the phosphor 81 is deposited on the lower side of the phosphor-containing layer 52 (in the case of the light emitting device 11' of FIG. 4) than in the case that the phosphor 81 is dispersed in the whole of the phosphor-containing layer 52 (in the case of the light emitting device 11 of FIG. 2). Accordingly, the light emitting device 11', in which the phosphor 81 is deposited, needs a smaller additive amount of the phosphor 81 to achieve an intended chromaticity than the light emitting device 11, in which the phosphor 81 is dispersed.

In order to manufacture the light emitting device 11' according to the modified example, a part of step 4 of the manufacturing method of the light emitting device 11 is modified. The other steps 1 to 3 are the same as those for the light emitting device 11. In step 4, before the liquid resin material is cured, the phosphor 81 in the liquid resin material is settled down so that the phosphor 81 is deposited on the upper surface 41 of the light transmissive member 40 and on the upper surface of the light reflecting layer 51. After the phosphor 81 is deposited, the liquid resin material is cured. In this way, the light emitting device 11' according to the present modified example is obtained.

Second Embodiment

The light emitting device according to the present embodiment is largely different from the light emitting device 11 according to the first embodiment in that the sealing member 50 covering the side surfaces 43 of the light transmissive member 40 is changed from the light reflecting layer 51 to the phosphor-containing layer 52. In addition, the light emitting device according to the present embodiment is different from the light emitting device 11 according to the first embodiment also in that the side surfaces 63 of the light emitting element 60 is directly covered with the light reflecting layer 51. The other configuration is the same as that in the light emitting device 11 according to the first embodiment. Hereinafter, a description will be made on points in which the light emitting device according to the present embodiment is different from the light emitting device 11 according to the first embodiment.

As shown in FIG. 5, in a light emitting device 12 according to the present embodiment, side surfaces 43 of a light transmissive member 40 is covered with a phosphor-containing layer 52 of a sealing member 50. Thus, light having spread in the light transmissive member 40 exits not only from an upper surface 41 of the light transmissive member 40 but also from the side surfaces 43 of the light transmissive member 40. The emitted light exiting from the side surfaces 43 further enlarges the practical light emitting area.

In addition, in the conventional white light emitting device, a phenomenon that the periphery of the light emitting device looks yellow (yellow ring phenomenon) tends to occur, and the phenomenon is a cause of a color unevenness of the light emitting device. The yellow ring phenomenon is thought to be caused when blue light traveling upward from the light emitting element is scattered by the phosphor and makes the phosphor around the light emitting element emit light. In the light emitting device 12 of the present embodiment, blue light exiting from the side surfaces 43 of the light transmissive member 40 reaches the surrounding area of the light emitting device, which blue light does not reach in the conventional light emitting device; thus, the occurrence of the yellow ring phenomenon can be reduced.

In the present embodiment, at least part of (preferably all of) a lower surface 45b of an outer extended part 45 of the light transmissive member 40 is further covered with the phosphor-containing layer 52 of the sealing member 50. Thus, the emitted light having spread in the light transmissive member 40 exits also from the lower surface 45b of the outer extended part 45. Because an upper surface 30a of the substrate 30 is covered with the light reflecting layer 51, the emitted light exiting downward from the lower surface 45b of the outer extended part 45 can be reflected upward, whereby the light extraction efficiency of the light emitting device 12 can be improved. In addition, the emitted light exiting also from the lower surface 45b of the outer extended part 45 also can contribute to reduction of the yellow ring phenomenon.

As the planar dimensions of the side surfaces 43 of the light transmissive member 40 increases, the amount of the blue light exiting from the side surfaces 43 increases, whereby the effect on the reduction of the yellow ring phenomenon increases. For this reason, the thicker light transmissive member 40 is more preferable. On the other hand, the thinner light transmissive member 40 is more preferable, because the height of the light emitting device can be accordingly lower. The thickness of the light transmissive member 40 is preferably 0.05 mm to 0.15 mm, and with such thickness, the light emitting device can be made thin while advantageous effects of improving the light extraction efficiency and reducing the yellow ring phenomenon can be obtained.

Next, with reference to FIG. 5, a manufacturing method of the light emitting device 12 according to the present embodiment will be described. The present embodiment is different from the first embodiment in that the light reflecting layer 51 is formed (step 3) before the light transmissive member 40 is placed (step 2).

<Step 1. Mounting Light Emitting Element 60>

In the same way as step 1 of the first embodiment, the housing 32 is formed, and the light emitting element 60 is mounted.

<Step 3. Forming Light Reflecting Layer 51>

In the same way as step 3 of the first embodiment, the light reflecting layer 51 can be formed of a resin material to which light reflective substance is added (light reflective resin). After light reflective substance is added to a liquid resin material before being cured, the liquid resin material is dropped in a gap between the side walls 31 of the housing 32 and the light emitting element 60. The dropped liquid resin material comes first in contact with the upper surface 30a of the substrate 30 and then climbs up, by surface tension, the inner surfaces 31b of the side walls 31 and the side surfaces 63 of the light emitting element 60, and covers the surfaces thereof. In this way, the light reflecting layer 51 having a cross-sectional shape as shown in FIG. 5 is easily formed. Finally, the liquid resin material is cured to form the light reflecting layer 51.

<Step 2. Placing Light Transmissive Member 40>

The light transmissive member 40 which has a larger planar dimension than that of the upper surface 61 of the light emitting element 60 is prepared, and is placed on the upper surface 61 of the light emitting element 60. Adhesive may cover not only the boundary between the upper surface 61 of the light emitting element 60 and the lower surface 42 of the light transmissive member 40 but also the lower surface 45b of the outer extended part 45 of the light transmissive member 40. Different from the first embodiment, the side surfaces 63 of the light emitting element 60 are already covered with the light reflecting layer 51; therefore, the side surfaces 63 of the light emitting element 60 are not covered with the adhesive. The adhesive is cured to form the light transmissive adhesive layer 70.

<Step 4. Forming Phosphor-Containing Layer 52>

In the same way as step 4 of the first embodiment, the phosphor-containing layer 52 can be formed of a resin material to which the phosphor 81 is added (phosphor-containing resin). After the phosphor 81 is added to a liquid resin material before being cured, the liquid resin material is dropped on the upper surface 41 of the light transmissive member 40. The dropped liquid resin material spreads from the upper surface 41 of the light transmissive member 40 to the side surfaces 43 of the light transmissive member 40, the lower surface 45b of the outer extended part 45, and the upper surface of the light reflecting layer 51, and fills the recessed portion 33. Finally, the liquid resin material is cured to form the phosphor-containing layer 52. In this way, the light emitting device 12 according to the present embodiment is obtained.

Modified Example

Figure 6:
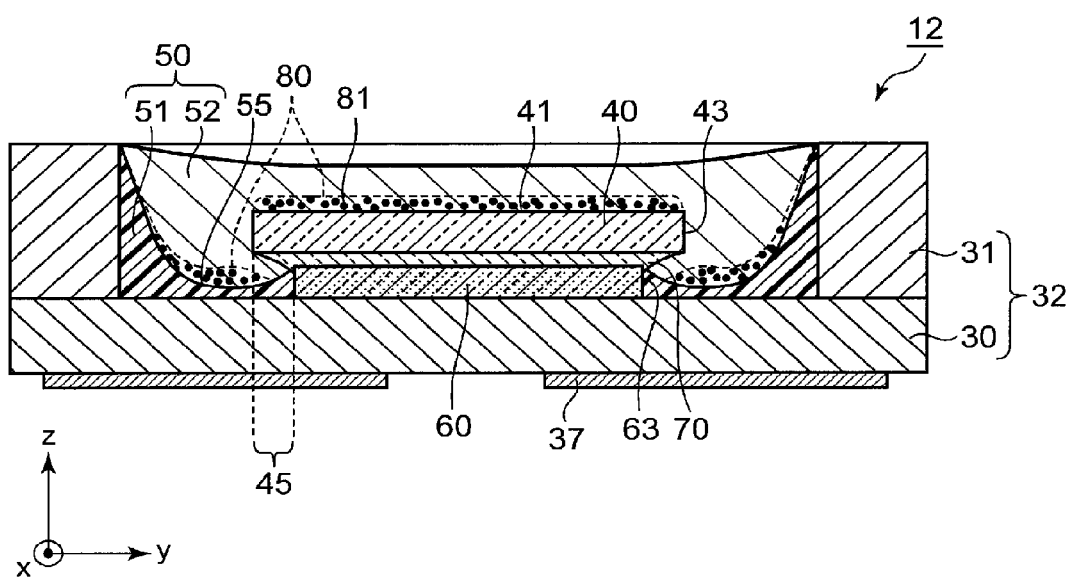
FIG. 6 is a schematic cross-sectional view of a modified example of a light emitting device according to the second embodiment.

FIG. 6 shows a light emitting device 12' according to the modified example of the present embodiment. In the light emitting device 12', in a phosphor-containing layer 52, a phosphor 81 is deposited on an upper surface 41 of a light transmissive member 40 and a boundary surface 55 between the phosphor-containing layer 52 and a light reflecting layer 51. However, the phosphor 81 is not deposited on the part under an outer extended part 45, and a phosphor layer 80 has a profile as shown in FIG. 6. Because the phosphor layer 80 does not substantially extend direct under the outer extended part 45, most of emitted light exiting downward from a lower surface 45b of the outer extended part 45 is reflected by the light reflecting layer 51 without colliding with the phosphor layer 80 (in other words, without being scattered by the phosphor 81 in the phosphor layer 80). Here, the upper surface (the boundary surface 55) of the light reflecting layer 51 has a cross-sectional shape of a surface curved outward and upward. Such a shape is made, for example, when the light reflective resin climes up the side surfaces 63 of the light emitting element 60 at the time of forming the light reflecting layer 51. With this arrangement, the emitted light exiting downward from the lower surface 45b of the outer extended part 45 is reflected outward and upward by the curved upper surface of the light reflecting layer 51, whereby it is possible to let the emitted light exit out of the light emitting device 12' without letting the emitted light return to the light transmissive member 40.

In addition, because the phosphor 81 is deposited in the same manner as in the modified example of the first embodiment, a smaller additive amount of the phosphor 81 is required to achieve a preferable conversion rate than in the case of the light emitting device 12, in which the phosphor 81 is dispersed.

In order to manufacture the light emitting device 12' according to the modified example, a part of step 4 of the manufacturing method of the light emitting device 12 is modified. The other steps 1 to 3 are the same as those for the light emitting device 12.

In step 4, before the liquid resin material is cured, the phosphor 81 in the liquid resin material is settled down so that the phosphor 81 is deposited on the upper surface 41 of the light transmissive member 40 and on the upper surface of the light reflecting layer 51. After the phosphor 81 is deposited, the liquid resin material is cured. In this way, the light emitting device 12' according to the present modified example is obtained.

Third Embodiment

Figure 7:
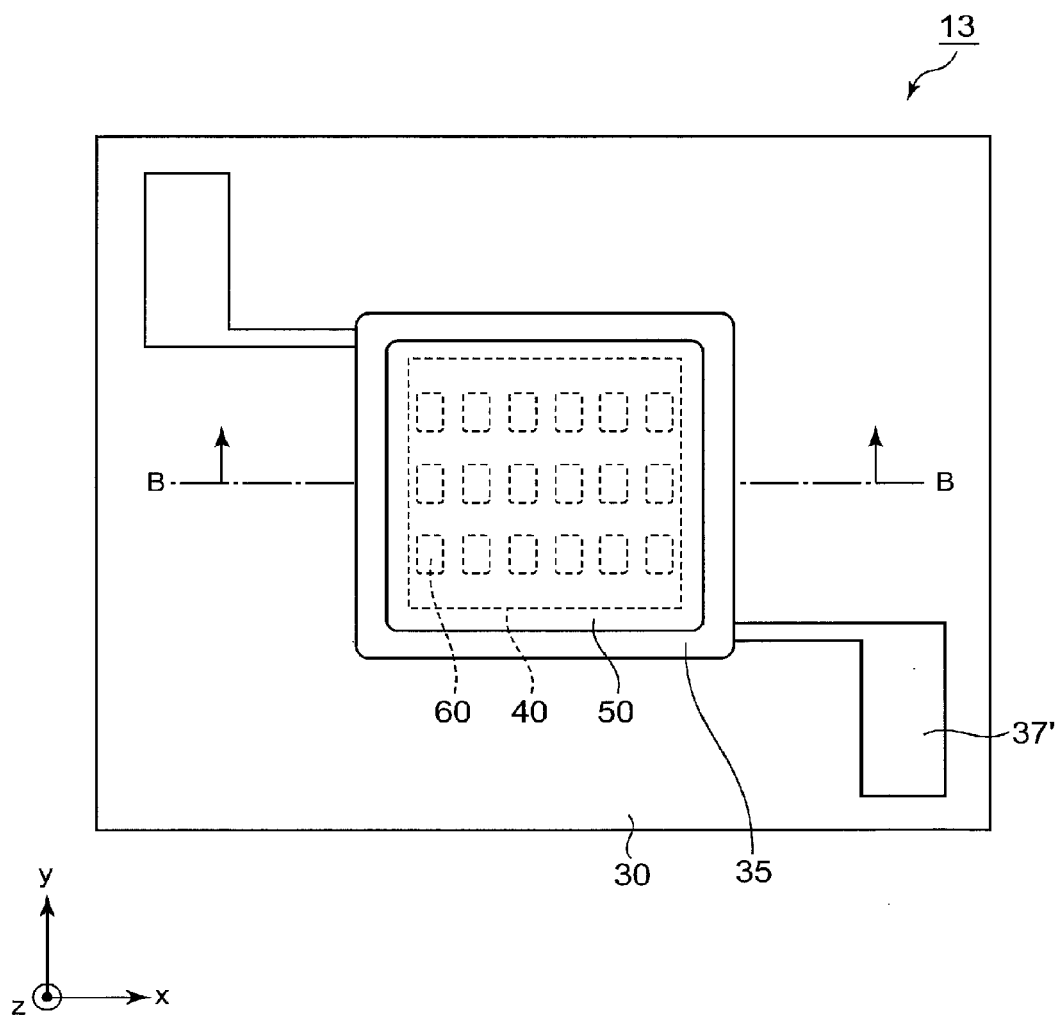
FIG. 7 is a schematic top view of a light emitting device according to a third embodiment.
Figure 8:
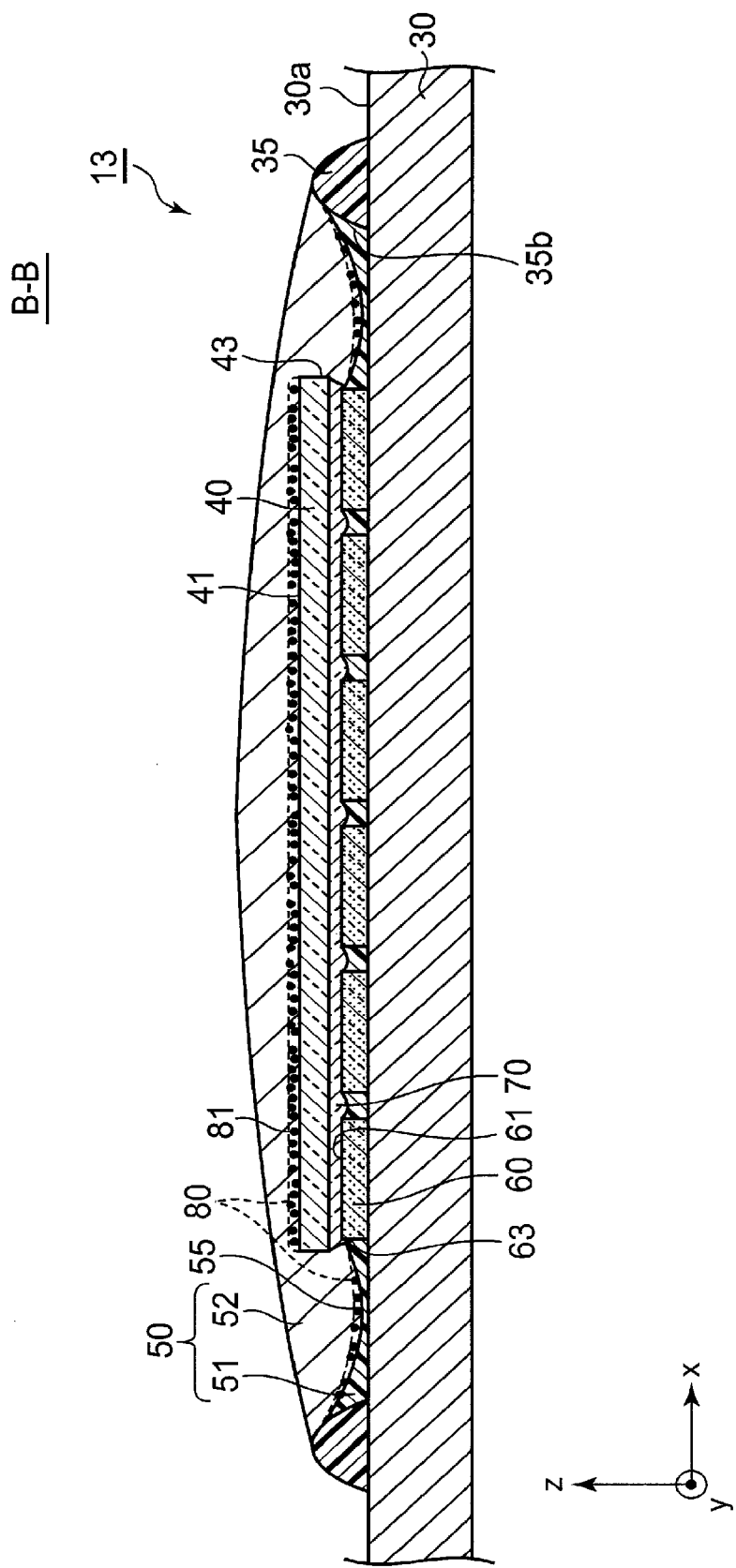
FIG. 8 is a schematic cross-sectional view of a light emitting device according to the third embodiment.

As shown in FIG. 7 and FIG. 8, a light emitting device 13 according to the present embodiment is a light emitting device of a so-called chip-on-board (COB) type. The light emitting device 13 includes a substrate 30, a plurality of light emitting elements 60 (3 by 6 in FIG. 7) mounted on an upper surface 30a of the substrate 30, and a plate-shaped light transmissive member 40 placed on an upper surfaces 61 of the light emitting elements 60. The light transmissive member 40 covers the plurality of light emitting elements 60, and the light transmissive member 40 and the light emitting elements 60 can be mutually fixed with a light transmissive adhesive layer 70. On the upper surface 30a of the substrate 30, there is provided a frame member 35 such that the frame member 35 surrounds the plurality of light emitting elements 60 and the light transmissive member 40. Inside the frame member 35, the light emitting elements 60 and the light transmissive member 40 are sealed with a sealing member 50 constituted by two layers.

The light emitting device 13 according to this embodiment has, in the same way as the first and second embodiments, the advantage effect of enlarging the practical light emitting area by using the light transmissive member 40 having a large planar dimension, and the advantage effect of improving the light extraction efficiency due to the fact that the use of the phosphor 81 is reduced. Further, in the present embodiment, a problem distinctive in the COB type light emitting devices can be solved. Hereinafter, the details will be described.

Because in the COB type light emitting device on which a plurality of light emitting elements are mounted, the plurality of light emitting elements are arranged with intervals therebetween; thus, it can be visually recognized, when the light emitting device is turned on, that the light emitting elements are separately arranged. Such a light emitting device is not preferable for a lighting purpose for which uniform illumination is desirable. To address this issue, in the conventional way, diffusing agent is added to the sealing resin so that individual light emitting elements are not visibly recognized. However, there is a problem that the added diffusing agent impairs the light extraction efficiency. In the present embodiment, by providing the light transmissive member 40 to cover the plurality of light emitting element 60, the light emitted from the light emitting elements 60 can be spread in the whole of the single light transmissive member 40, whereby it is made difficult to visibly recognize the individual light emitting elements. In addition, the diffusing agent does not have to be added to the sealing resin, whereby the light extraction efficiency is not likely to be impaired.

As described above, with the present embodiment, a COB type light emitting device can be provided which emits uniform light as a whole while individual light emitting elements are hardly visibly recognized and in which the light extraction efficiency is improved.

Next, with reference to FIG. 8, a manufacturing method of the light emitting device 13 according to the present embodiment will be described. The present embodiment is largely different in that new "step 5" is newly included after step 1.

<Step 1. Mounting Light Emitting Elements>

A substrate 30 on which conductor wirings such as external electrodes 37 are prepared, and a plurality of light emitting elements 60 are mounted on an upper surface 30a of the substrate 30. At this time, by appropriately connecting electrodes of the light emitting element 60 to the conductor wirings provided on the substrate 30, the light emitting element 60 can be supplied with electricity from the external electrodes 37.

<Step 5. Forming Frame Member 35>

The frame member 35 can be formed of a resin material, and in particular, it is preferable that the frame member 35 is formed of a light reflective resin, to which light reflective substance is added. After light reflective substance is added to a paste-like resin material before being cured, a shape of the frame member 35 is drawn on the substrate 30 by using a device (for example, a dispensing device like a syringe) capable of ejecting the paste-like resin material. Finally, the paste-like resin material is cured to form the frame member 35. With this method, the frame member 35 can be formed without using a molding die. Not only one but also a plurality of flame members 35 may be formed. For example, a resin frame, to be described later, for forming a phosphor layer can be separately provided. When a plurality of resin frames are formed, the plurality of frame members may be formed one on the other, or a plurality of frame members may be formed such that the first frame is surrounded by another in a planar view.

<Step 3. Forming Light Reflecting Layer 51>

In the same way as step 3 of the first and second embodiments, a light reflecting layer 51 can be formed of a resin material to which light reflective substance is added (light reflective resin). After light reflective substance is added to a liquid resin material before being cured, the liquid resin material is dropped in a gap between the frame member 35 and the light emitting element 60. The dropped liquid resin material comes first in contact with the upper surface 30a of the substrate 30 and then climbs up, by surface tension, the inner surfaces 35b of the frame member 35 and side surfaces 63 of the light emitting elements 60, and covers the surfaces thereof. In this way, the light reflecting layer 51 having a cross-sectional shape as shown in FIG. 8 is easily formed. Finally, the liquid resin material is cured to form the light reflecting layer 51.

<Step 2. Placing Light Transmissive Member 40>

The light transmissive member 40 having a size large enough to cover the plurality of light emitting elements 60 is prepared, and is placed on the upper surfaces 61 of the plurality of light emitting element 60 to cover the upper surfaces 61. At this time, it is preferable that the light emitting element 60 and the light transmissive member 40 are mutually fixed with adhesive. The adhesive is cured to form the light transmissive adhesive layer 70. Because the light transmissive member 40 is placed to completely cover the upper surfaces 61 of the plurality of light emitting elements 60, the emitted light exiting from the upper surfaces 61 of the light emitting elements 60 can be efficiently introduced into the single light transmissive member 40.

<Step 4. Forming Phosphor-Containing Layer 52>

In the same way as step 4 of the first and second embodiments, the phosphor-containing layer 52 can be formed of a resin material to which the phosphor 81 is added (phosphor-containing resin). After the phosphor 81 is added to a liquid resin material before being cured, the liquid resin material is dropped on the upper surface 41 of the light transmissive member 40. The dropped liquid resin material spreads from the upper surface 41 of the light transmissive member 40 to a side surfaces 43 of the light transmissive member 40, a lower surface 45b of an outer extended part 45, and the upper surface of the light reflecting layer 51, and fills the recessed portion 33. Note that, the liquid resin material may be formed to be protruded by surface tension. With this arrangement, even when the height of the frame member 35 is low, the upper surface 41 of the light transmissive member 40 can be covered with the phosphor-containing layer 52. Finally, the liquid resin material is cured to form the phosphor-containing layer 52. Note that because such light emitting device 13 as shown in FIG. 8 has a structure in the phosphor 81 is deposited in the same way as the modified examples of the first and second embodiments, the phosphor 81 in the liquid resin material is settled down before the liquid resin material is cured. In this way, the phosphor 81 can be deposited on the upper surface 41 of the light transmissive member 40 and the upper surface of the light reflecting layer 51. After the phosphor 81 is deposited, the liquid resin material is cured. In this way, the light emitting device 13 according to the present embodiment is obtained. Before the phosphor-containing layer is formed, a frame member may be separately provided to form the phosphor-containing layer. For example, by separately providing the frame member for forming the light reflecting layer and the frame member for forming the phosphor-containing layer, it is possible to appropriately adjust a rising height of the light reflecting layer on the inner surfaces of the frame member and a surface shape of the phosphor-containing layer. Alternatively, the first sealing resin (light reflecting layer) and the frame member can be integrally formed, and the first sealing resin can be the frame member for forming the phosphor-containing layer.

Hereinafter, materials appropriate for structural members for the light emitting devices 11 to 13 of the first to third embodiments will be described.

(Substrate 30)

The substrate 30 can be formed of, for example, resin materials (for example, epoxy-based resins such as a glass epoxy resin), insulating materials such as ceramic (HTCC, LTCC), composite materials of an insulating material and a metal member, and the like. Particularly preferable is ceramic materials, which have high heat resistance and high whether resistance. Specific examples of the ceramic material include, alumina, aluminum nitride, and mullite.

(Side Wall 31)

In the present invention, the housing 32 can be formed, including the side walls 31 fixed on the upper surface 30a of the substrate 30. As a material for the side walls 31, insulating materials similar to those for the substrate 30 are preferably used, and examples include resin materials (for example, epoxy-based resins such as a glass epoxy resin), insulating materials such as ceramic materials, composite materials made of a conductive material such as metal covered with an insulating material. However, if a conductor wiring does not come in contact with the side walls 31, the side walls 31 can be made of a conductive material such as metal.

(Frame Member 35)

The frame member 35 can be made of a resin material such as a silicone resin (for example, a dimethyl silicone resin) and an epoxy resin. Further, filler can be added to the resin material to improve physical or mechanical characteristics of the resin material. For example, by adding titanium oxide to the resin material, an optical reflectance of the frame member 35 can be increased.

(Light Emitting Element 60)

As the light emitting element 60, a semiconductor light emitting element (for example, an LED) can be used. The semiconductor light emitting element is configured with a laminated structure constituted by a substrate for a light emitting element and semiconductor layers including nitride semiconductor such as InN, AlN, GaN, InGaN, AlGaN, and InGaAlN, group III-V compound semiconductor, and group II-VI compound semiconductor which are stacked thereon.

(Light Transmissive Member 40)

The light transmissive member 40 is a plate-shaped member for transmitting the light emitted from the light emitting element 60 and is formed of a material transparent to the emitted light. Different from JP 2012-4303 A and JP 2010-192629 A, the light transmissive member 40 does not contain the phosphor 81. Examples of preferable materials for the light transmissive member 40 include a glass material such as a silicate glass, a borosilicate glass, and a silica glass, a light transmissive resin such as an epoxy resin and a silicone resin, and sapphire.

(Light Reflecting Layer 51)

The light reflecting layer 51 constituting the sealing member 50 can be formed of a light reflective material having a high optical reflectance. As the light reflective material, a resin material to which light reflective substance is added is preferable, and it is easy to form the light reflecting layer 51 in a form as described in the first to third embodiments of the present application. As the resin material, there can be preferably used, for example, a silicone resin, a modified silicone resin, an epoxy resin, a modified epoxy resin, an acrylic resin, or a hybrid resin containing one or more types of these resins. As the light reflective substance, preferable is a material which has a high reflectance to any of the emitted light (for example, emitted blue light)

from the light emitting element 60 and the light having been wavelength converted (for example, yellow fluorescent light) by the phosphor 81 and which can be dispersed in a resin material. As the light reflective substance, there can be preferably used titanium oxide, silicon dioxide, titanium dioxide, zirconium dioxide, potassium titanate, alumina, aluminum nitride, boron nitride, mullite, and the like, for example.

(Phosphor-Containing Layer 52)

The phosphor-containing layer 52 constituting the sealing member 50 can be formed of a light transmissive material containing the phosphor 81. As the light transmissive material, preferable is a resin material to which the phosphor 81 is added, and it is easy to form the phosphor-containing layer 52 in a form as described in the first to third embodiments. As the resin material, there can be preferably used a silicone resin, a modified silicone resin, an epoxy resin, a modified epoxy resin, an acrylic resin, a hybrid resin containing one or more types of these resins, for example.

(Phosphor 81)

As the phosphor 81, selected is a substance which absorbs the light emitted from the light emitting element 60 and wavelength converts the absorbed light into light having a different wavelength. Regarding the phosphor, one known in the field can be used. Examples include, a cerium-activated yttrium aluminum garnet (YAG)-based phosphor, a cerium-activated lutetium aluminum garnet (LAG), europium and/or chromium-activated nitrogen-containing calcium aluminosilicate ($CaO-Al_2O_3-SiO_2$)-based phosphor, a europium-activated silicate (($Sr,Ba)_2SiO_4$)-based phosphor, β-sialon phosphor, a nitride-based phosphor such as a CASN-based or SCASN-based phosphor, a KSF-based phosphor ($K_2SiF_6$:Mn), a sulfide-based phosphor, and the like. With this arrangement, there can be made a light emitting device which emits mixed-color light (for example, white light) of primary light and secondary light both having visible wavelengths or a light emitting device which is excited by ultraviolet primary light and emits secondary light having a visible wavelength. As the phosphor, a plurality types of phosphors may be used in combination. By using some types of phosphors in a combination at a compounding ratio which is appropriate for an intended chromaticity, color rendering properties and color reproducibility can also be adjusted. For example, different types of phosphor may be used as the phosphor covering the upper surface of the light transmissive member 40 and as the phosphor deposited on the boundary surface between the second sealing member and the first sealing member.

(Adhesive Layer 70)

The adhesive layer 70 is formed of a material which is transparent to the light emitted from the light emitting element 60. The adhesive layer 70 may be formed of a resin-based adhesive such as epoxy or silicone, for example.

Example 1

Measuring Luminous Flux

Luminous fluxes of the light emitting elements were measured to observe improvement of the light extraction efficiency of the light emitting elements according to the present invention. As light emitting devices for measurement, the light emitting devices 11' (samples 1a to 1c) shown in FIG. 4 and the light emitting devices 12 (sample 2a to 2c) shown in FIG. 6 were prepared. As a comparative example, the light emitting device (comparative sample 3a) which does not have the light transmissive member 40 was also prepared.

For each sample, a nitride semiconductor type blue light emitting element (0.8 mm side square) was used as the light emitting element 60. The light transmissive members 40 were formed of plate-shaped glass, and the sizes were 1.0 mm length, 1.0 mm width, and 0.05 mm to 1.45 mm thickness. Specific thicknesses of the light transmissive members 40 are shown in Table 1. The light reflecting layers 51 were formed of a light reflective material (concentration of titanium oxide was 30 wt. %) in which titanium oxide was added to a silicone resin. In the phosphor-containing layer 52, a YAG phosphor was used as the phosphor 81. The concentration of the phosphor in the phosphor-containing layer 52 was adjusted so that an emitted light color shows white (chromaticity: (x, y)≈(0.3, 0.3)) at the center when observed from the front of the light emitting device.

The prepared samples each were supplied with a current of 350 mA to emit light, and the luminous flux was measured. Table 1 shows measured values (lm) of the luminous fluxes and relative values (%) thereof when the luminous flux of the comparative sample 3a is set to 100%.

TABLE 1

| | Thickness of light transmissive member 40 (mm) | Luminous flux (lm) | Relative value of luminous flux (%) |
|---|---|---|---|
| Sample 1a | 0.05 | 118 | 109 |
| Sample 1b | 0.10 | 118 | 109 |
| Sample 1c | 0.145 | 118 | 109 |
| Sample 2a | 0.05 | 120 | 111 |
| Sample 2b | 0.10 | 124 | 115 |
| Sample 2c | 0.145 | 126 | 117 |
| Comparative sample 3a | — | 108 | 100 |

It was confirmed that the luminous fluxes were higher by about 9% to 17% for the samples 1a to 1c and 2a to 2c which had the light transmissive members 40 than for the comparative sample 3a which did not have the light transmissive member 40. In particular, as for the samples 2a to 2c, the luminous fluxes were higher by as much as 11% to 17%, and it was confirmed that the thicker light transmissive member 40 provided the higher luminous flux. These results shows that the light transmissive member 40 larger than the light emitting element placed on the light emitting element increases the luminous flux and thereby improves the light extraction efficiency. The samples 2a to 2c whose side surfaces 43 of the light transmissive members 40 are not covered with the light reflecting layer 51 have higher luminous flux and thus have a higher effect of improving the light extraction efficiency than the samples whose side surfaces 43 are covered with the light reflecting layer 51. In particular, it can also be seen that, when the light transmissive member 40 is thicker (in other words, when the planar dimension of the side surface 43 is larger), the luminous flux is higher, and the effect of improving the light extraction efficiency is thus remarkable. This shows that, by increasing the emitted light exiting from the side surfaces 43, the light extraction efficiency of the light emitting device is improved.

Example 2

Measuring Angle Dependency of Emitted Light Color

The relation (angle dependency) between the emitted light color of a white color light-emitting device and measurement angles was examined. The same samples as in Example 1 were measured. Each of the samples was supplied with a current of 350 mA to emit light, and the emitted light color was measured while changing the measurement angle. The measurement angle was defined by an angle θ measured from the optical axis C (which is parallel to the z-axis and passes through the center of the light emitting device when viewed from above; see FIG. 2) of the light emitting device. When performing the measurements, the measurements were performed while the angle θ was changed in an x-z plane (xz plane measurement) and while the angle θ was changed in a y-z plane (yz plane measurement).

The emitted light color was evaluated by using x value and y value based on the CIE standard colorimetric system. With a chromaticity (white) of an emitted light color when θ=0° as a reference value, the emitted light color was evaluated by using deviations (Δx, Δy) between the measured values and the reference value. The deviations Δx and Δy and the emitted light color are in the following relations. First, if the deviations Δx and Δy are smaller, the emitted light color is closer to the white light. If the deviations Δx and Δy are both positive values, the emitted light color is shifted toward yellow. If the deviations Δx and Δy are both negative values, the emitted light color is shifted toward blue.

The measurement results of the samples are shown in FIG. 9A to FIG. 15B. As can be understood from the graphs, because the maximum values of the deviations Δx and Δy of the xz plane measurement and the yz plane measurement were almost the same, the results of the xz plane measurement are used to discuss the measurement results. In addition, because the graph for θ=0° to 90° and the graph for θ=0° to −90° are approximately symmetrical about the vertical axis for each of the graphs, only the graph for the range of θ=0° to 90° is discussed. Further, the measurements for the angle θ=80° to 90° correspond to approximate edge-on (x-axis direction or y-axis direction) observations of the light emitting device, and almost no visual recognition is performed in such angle range in actual lighting applications. Therefore, only the emitted light color within the range of θ=0° to 80° were evaluated. The following items are listed in Table 2.

Item 1: The maximum values of Δx and Δy of the samples (in other words, Δx, Δy where θ=80°).

Item 2: Relative values (%) of the maximum values of Δx and Δy when the maximum values of Δx and Δy of the reference sample 3a are set to 100%.

Item 3: The relative values are evaluated as follows: the relative value of 100% shows no change (in other words, no improvement shown in the angle dependency of emitted light color); the relative value of 60% to 99% shows some improvement and is preferable; and the relative value of 0% to 60% shows remarkable improvement and is most preferable.

TABLE 2

| | xz plane measurement | | | |
|---|---|---|---|---|
| | Maximum value of Δx | Relative value (%) | Maximum value of Δy | Relative value (%) |
| Sample 1a | 0.025 | 100 | 0.050 | 100 |
| Sample 1b | 0.025 | 100 | 0.050 | 100 |
| Sample 1c | 0.020 | 80 | 0.040 | 80 |
| Sample 2a | 0.015 | 60 | 0.025 | 50 |

TABLE 2-continued

| | xz plane measurement | | | |
|---|---|---|---|---|
| | Maximum value of Δx | Relative value (%) | Maximum value of Δy | Relative value (%) |
| Sample 2b | 0.007 | 28 | 0.020 | 40 |
| Sample 2c | 0.005 | 20 | 0.010 | 20 |
| Comparative sample 3a | 0.025 | 100 | 0.050 | 100 |

Comparative Sample 3a

As shown in FIGS. 15A and 15B, the deviations Δx and Δy of the comparative sample 3a were almost 0 for 0≤θ≤15°. The deviations Δx and Δy were both increased for θ>15°, and Δx=0.025 and Δy=0.050 (yellowish white light) for θ=80°.

Samples 1a to 1c

As shown in FIGS. 9A and 9B, the results of the sample 1a were almost the same as the comparative sample 3a.

As shown in FIGS. 10A and 10B, the deviations Δx and Δy of the sample 1b were both almost 0 for 0≤θ≤10°. The deviations Δx and Δy were both increased for θ>10°, and Δx=0.025 and Δy=0.050 (yellowish white light) for θ=80°. As shown in FIGS. 11A and 11B, the deviations Δx and Δy of the sample 1c were both almost 0 for 0≤θ≤10°. The deviations Δx and Δy were both increased for θ>10°, and Δx=0.020 and Δy=0.040 (slightly yellowish white light) for θ=80°.

Samples 2a to 2c

As shown in FIGS. 12A and 12B, the deviations Δx and Δy of the sample 2a were both almost 0 for 0≤θ≤15°. The deviations Δx and Δy were both increased for θ>15°, and Δx=0.015 and Δy=0.025 (very slightly yellowish but can be seen approximately white light) for θ=80°. As shown in FIGS. 13A and 13B, the deviations Δx and Δy of the sample 2b were both almost 0 for 0≤θ≤15°. The deviations Δx and Δy were both increased for θ>15°, and Δx=0.007 and Δy=0.020 (pure white light) for θ=80°. As shown in FIGS. 14A and 14B, the deviations Δx and Δy of the sample 2c were both almost 0 for 0≤θ≤30°. The deviations Δx and Δy were both increased for θ>30°, and Δx=0.005 and Δy=0.010 (pure white light) for θ=80°.

The evaluation of Table 2 shows, with respect to the angle dependency of emitted light color, the followings: the samples 1a and 1b were similar to the comparative sample 3a; the sample 1c was slightly improved; and the samples 2a to 2c were much improved. In short, the samples 1a to 1c which have the light transmissive member 40 were hardly improved in the angle dependency of emitted light color compared to the comparative sample 3a which does not have the light transmissive member 40. It is presumed that the angle dependency of emitted light color is not improved only by placing the light transmissive member 40 on the light emitting element 60. However, the samples 2a to 2c, in which the light transmissive member 40 is placed and the side surfaces 43 of the light transmissive member 40 are not covered with the light reflecting layer 51, have been largely improved in the angle dependency of emitted light color compared to the comparative sample 3a. In particular, it can be understood that, when the light transmissive member 40 is thicker (in other words, the planar dimensions of the side surfaces 43 are larger), the angle dependency of emitted light color is more reduced, whereby almost white light is emitted regardless of a visual recognition direction. From this, it was found that by making the emitted light exit from the side surfaces 43 of the light transmissive member 40, the angle dependency of emitted light color can be effectively improved.

Some embodiments according to the present invention have been described by using examples above; however, the present invention is not limited to the above-described embodiments, and it goes without saying that the present invention can be arbitrarily configured without departing from the spirit of the present invention.

What is claimed is:

1. A light emitting device, comprising:
   a substrate;
   at least one light emitting element mounted on the substrate;
   a plate-shaped light transmissive member disposed on an upper surface of the at least one light emitting element wherein the light transmissive member is larger than the at least one light emitting element when viewed from above;
   a light transmissive adhesive layer fixing the light transmissive member and the at least one light emitting element; and
   a sealing member which seals the at least one light emitting element and the light transmissive member,
   wherein the sealing member includes:
      a first sealing member which is formed of a light reflecting member for reflecting light emitted from the at least one light emitting element and covers side surfaces of the at least one light emitting element; and
      a second sealing member which covers at least an upper surface of the light transmissive member.

2. The light emitting device according to claim 1, wherein the second sealing member contains a phosphor for converting the light emitted from the at least one light emitting element into light having a second wavelength different from a first wavelength of the at least one light emitted from the light emitting element.

3. The light emitting device according to claim 1, wherein the second sealing member is a phosphor layer to cover the upper surface of the light transmissive member.

4. The light emitting device according to claim 1, wherein the second sealing member covers side surfaces of the light transmissive member.

5. The light emitting device according to claim 1, wherein the second sealing member covers at least a part of a lower surface of an outer extended part of the light transmissive member which extends out of the at least one light emitting element when viewed from above.

6. The light emitting device according to claim 1, wherein the first sealing member covers an upper surface of the substrate.

7. The light emitting device according to claim 1, wherein the first sealing member comprises a resin material.

8. The light emitting device according to claim 1, wherein the second sealing member comprises a resin material.

9. The light emitting device according to claim 2, wherein the phosphor is deposited, in the second sealing member, on the upper surface of the light transmissive member and on a boundary surface between the second sealing member and the first sealing member.

10. The light emitting device according to claim 1, further comprising side walls fixed on an upper surface of the substrate.

11. The light emitting device according to claim 10, wherein the first sealing member covers inner surfaces of the side walls.

12. The light emitting device according to claim 1, wherein the at least one light emitting element comprises a plurality of the at least one light emitting element.

13. The light emitting device according to claim 12, wherein the light transmissive member covers the plurality of light emitting elements.

14. The light emitting device according to claim 1, wherein the light transmissive adhesive layer is formed of an epoxy resin or a silicone resin.

15. The light emitting device according to claim 1, wherein a thickness of the light transmissive member is 0.05 millimeters to 0.15 millimeters.

* * * * *